United States Patent [19]

Engles

[11] Patent Number: 4,500,961
[45] Date of Patent: Feb. 19, 1985

[54] PAGE MODE MEMORY SYSTEM

[75] Inventor: Bruce E. Engles, Austin, Tex.

[73] Assignee: Motorola, Inc., Schaumburg, Ill.

[21] Appl. No.: 500,705

[22] Filed: Jun. 3, 1983

[51] Int. Cl.³ ............................................. G06F 9/30
[52] U.S. Cl. .................................................. 364/200
[58] Field of Search ........................ 364/200 MS File

[56] References Cited

U.S. PATENT DOCUMENTS

| 3,737,860 | 6/1973 | Sporer | 364/200 |
|---|---|---|---|
| 4,037,214 | 7/1977 | Birney et al. | 364/200 |
| 4,118,773 | 10/1978 | Raguin et al. | 364/200 |
| 4,158,227 | 6/1979 | Baxter et al. | 364/200 |
| 4,240,142 | 12/1980 | Blahut et al. | 364/200 |
| 4,374,417 | 2/1983 | Bradley et al. | 364/200 |

Primary Examiner—Thomas M. Heckler
Attorney, Agent, or Firm—Anthony J. Sarli, Jr.; Jeffrey Van Myers; James L. Clingan, Jr.

[57] ABSTRACT

A multi-page ROM uses programmable pointers for selection of a page. The pointers each have a preliminary latch circuit, an output latch circuit, and a delay circuit. The preliminary latch circuit receives and stores program address signals when a first signal is present. The output latch receives the address stored in the preliminary latch when a second signal is present. The delay circuit removes the first signal before the second signal is present and delays the presence of the first signal for a delay period following the removal of the second signal.

8 Claims, 4 Drawing Figures

PAGE MODE MEMORY SYSTEM

This invention relates to page mode memory systems, and more particularly, to page mode memory systems which use pointers for page selection.

BACKGROUND OF THE INVENTION

Page mode memories have been developed to increase the amount of memory that is available for use in a system when the number of address lines is limited. U.S. Pat. No. 4,368,515, Nielsen, describes such a purpose. In conventional techniques the number of memory locations which can be addressed when the number of address bits is n, is 2 to the n power. For the case of n=12, the maximum number of memory locations which can be accessed is 4096. The technique described in the above patent doubles the addressable memory space by designating a particular address as determining which half of the memory will provide the data in response to the addresses until a second predetermined address is received causing the other half of the memory to provide the data. In such a case, each half represents a page or bank. Using more than two pages in doubling the amount of memory adds flexibility. At any given time, whether 2 pages or more than two pages, only one half of the memory is accessible. But with only two pages, accessible memory is always in one of the two specific pages. If, however, there are eight pages, any four could be accessible at a given time i.e., the particular half of the memory which is accessible could be made up of any four of the pages. This adds to user flexibility.

A programmable system, however, is required to implement the flexibility of choosing which four pages are to form the one half of accessible memory. In so doing there is then a problem of address skew causing false programming. The addresses may change at somewhat different times so that during such a transition one of the programming addresses may accidentally be obtained, thereby unknowingly changing the state of the programmed circuit which selects the accessible page or pages. Obviously, it is of critical importance to know which pages are accessible at any given time. An additional problem in this regard relates to coming out of a programming cycle. The signals which contain the information to be stored may change too quickly for the comparatively complicated logic circuitry associated with controlling the storage to respond to such transition.

SUMMARY OF THE INVENTION

An object of the subject invention is to provide an improved multi-page ROM.

Another object of the invention is to provide a multi-page ROM which uses improved programmable pointers in the selection of a page.

Yet another object of the invention is to provide a multi-page ROM having programmable pointers for selection of a page, wherein the pointers have improved programming reliability.

These and other objects of the invention are achieved in a multi-page ROM having a plurality of pointers which are selectively programmable to provide a decoder address which corresponds to a chosen page of the ROM and which are programmed in response to a selection address. A pointer has a preliminary latch circuit, an output latch circuit, and a delay circuit. The preliminary latch circuit receives and stores program address signals when a first signal is present. The output latch receives the address stored in the preliminary latch when a second signal is present. The delay circuit removes the first signal before the second signal is present and delays the presence of the first signal for a delay period following the removal of the second signal.

DESCRIPTION OF A PREFERRED EMBODIMENT

Figure 1:
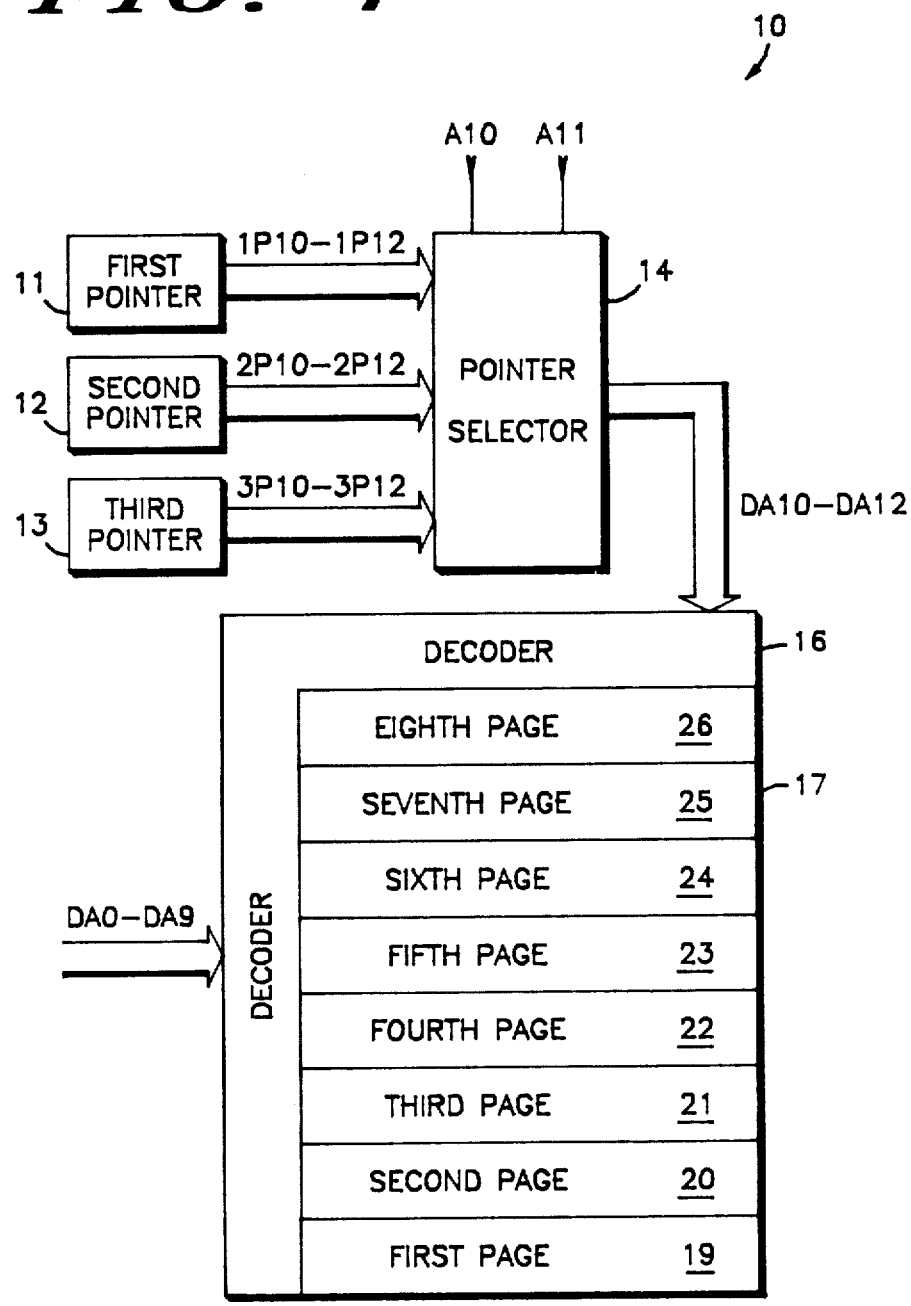
FIG. 1 is a system schematic of a ROM with more than two pages.

Shown in FIG. 1 is a memory circuit 10 comprised generally of a first pointer 11, a second pointer 12, a third pointer 13, a pointer selector 14, a decoder 16, and a memory array 17. Array 17 is comprised of a first page 19, a second page 20, a third page 21, a fourth page 22, a fifth page 23, a sixth page 24, a seventh page 25, and an eighth page 26.

FIG. 1 is useful for describing the normal operation of memory circuit 10. Decoder 16 receives thirteen buffered address signals DA0, DA1, DA2, DA3, DA4, DA5, DA6, DA7, DA8, DA9, DA10, DA11, and DA12 for making a 1 of 8192 selection from array 17. In this particular embodiment, array 17 is a read only memory array which has 8192 bytes i.e., an 8K×8 ROM array. Each page 19-26 has 1024 bytes. In response to receiving address signals DA0-DA12, decoder 16 selects one byte from array 17. Address signals DA10-DA12 determine from which page 19-26 a byte is selected. Address signals DA0-DA9 determine which byte within the selected page 19-26 is selected.

Pointers 11-13 each provide 3 pointer address signals to pointer selector 14. Pointer 11 provides signals 1P10, 1P11, and 1P12. Pointer 12 provides signals 2P10, 2P11, and 2P12. Pointer 13 provides signals 3P10, 3P11, and 3P12. Each pointer 11-13 is programmed to provide its respective pointer signals at known logic states. Pointer selector 14, in response to address signals A10 and A11, selects the pointer address signals of one of the pointers 11-13 to be signals DA10-DA12 which in turn select one of the eight pages 19-26, except in the case where both address signals A10 and A11 are a logic high, in which case, pointer selector 14 provides all signals DA10-DA12 at a logic high so that eighth page 26 is selected. This feature of automatically selecting a particular page, page 26, in this case, in response to a certain address condition is for user convenience. The user always has a page, page 26, which is accessible without regard to the program state of pointers 11-13.

Each pointer 11-13 is thus programmed to correspond to a particular page 19-26. Signals A10 and A11 select one of the three pointers 11-13 or select page 26. Consequently, at any given time four of the eight pages 19-26 can be selected, unless of course more than one of pointers 11-13 is programmed to correspond to the same page or one of pointers 11-13 is programmed to correspond to page 26. At any given time then, one half of array 17 is accessible. The accessible half will always include page 26. There is complete flexibility, however, in selecting the three remaining accessible pages from pages 19-25 to obtain an accessible half. Pointers 11-13 can be programmed to correspond to any of pages 19-25 to form the accessible half. Memory circuit 10 receives only address signals A0-A11 externally. Signals A0-A9 are buffered by conventional means to be received by decoder 16 as signals DA0-DA9. For ease of understanding, only true signals have been used in the description of memory circuit 10. It will be understood that complementary signals are also generated by conventional means for convenient use. For example, in a conventional decoder, both true and complementary address signals are used, but in FIG. 1 only true signals DA0-DA9 are shown for simplicity.

As a system specification, pointers 11-13 can be programmed only when address signals A5-A11 are all a logic high. Signals A3 and A4 select which pointer will be programmed. Signals A0-A2 define what is programmed into the selected pointer. Because signals A10 and A11 will both be a logic high for programming a pointer, a location in page 26 will always be selected when programming.

Figure 2:
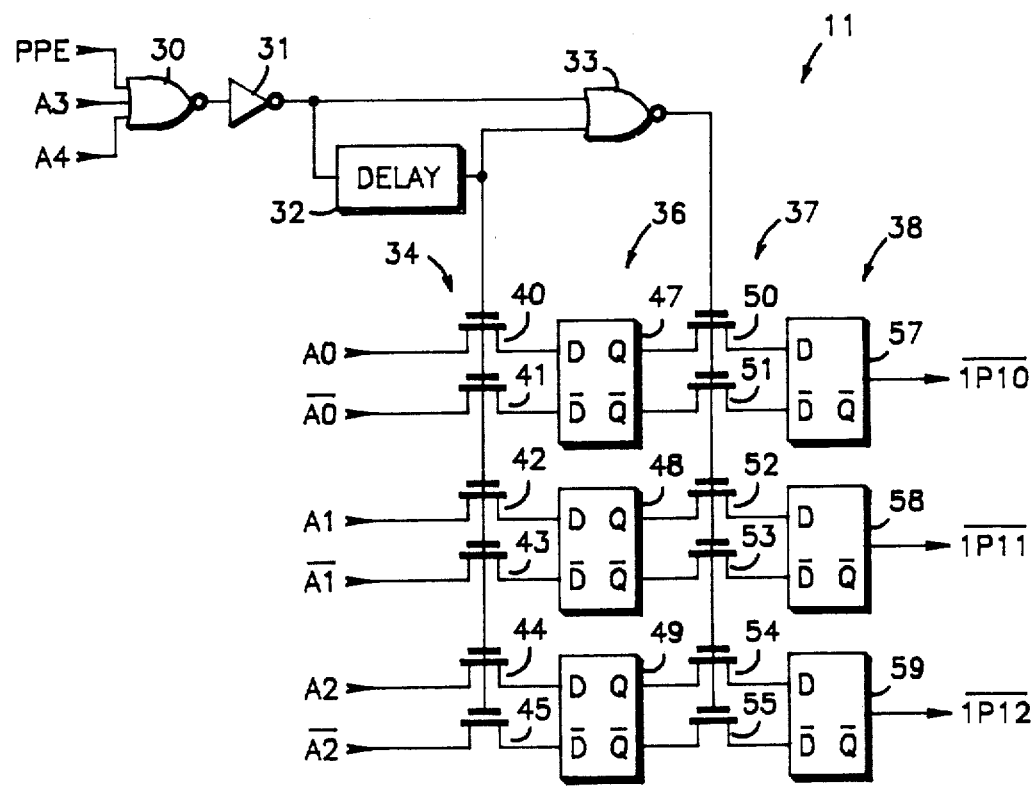
FIG. 2 is a schematic diagram of a pointer circuit used in the ROM of FIG. 1 and according to a preferred embodiment of the invention.

Shown in FIG. 2 is a schematic diagram of pointer 11 which is comprised of a three-input NOR gate 30, an inverter 31, a delay circuit 32, a two-input NOR gate 33, a first plurality of N channel transistors 34, a first plurality of static latches 36, a second plurality of N channel transistors 37, and a second plurality of static latches 38. First plurality of transistors 34 comprises transistors 40, 41, 42, 43, 44, and 45. First plurality of latches 36 comprises latches 47, 48, and 49. Second plurality of latches 38 comprises latches 57, 58, and 59. Each of latches 37-39 are constructed by any conventional means and have a true and complementary inputs D and $\overline{D}$, and true and complementary outputs Q and $\overline{Q}$. Each of latches 57-59 are also constructed by any conventional means and have true and complementary inputs D and $\overline{D}$ and a complementary output $\overline{Q}$.

NOR gate 30 has a first input for receiving a program pointer enable signal PPE, a second input for receiving address signal A3, a third input for receiving address signal A4, and an output. Inverter 31 has an input coupled to the output of NOR gate 30, and an output. Delay circuit 32, constructed by any conventional means, has an input coupled to the output of inverter 31, and an output. NOR gate 33 has a first input coupled to the output of inverter 31, and a second input coupled to the output of delay circuit 32. Each of the transistors 40-45 has a gate coupled to the output of delay circuit 32, and first and second current electrodes for coupling address signals A0-A2 to latches 47-49 when the output of delay circuit 32 is a logic high. Transistors 40 and 41 are coupled between address signal A0 and latch A7, in particular, transistor 40 is coupled between true address signal A0 and true input D, and transistor 41 is coupled between complementary address signal $\overline{A0}$ and complementary input $\overline{D}$. Likewise, transistors 42 and 43 are coupled between address signals A1, $\overline{A1}$ and inputs D, $\overline{D}$, respectively, of latch 48, and transistors 44 and 45 are coupled between address signals A2, $\overline{A2}$ and inputs D, $\overline{D}$, respectively, of latch 49.

Each of transistors 50-55 has a gate coupled to the output of NOR gate 33 and first and second current electrodes for coupling true outputs of Q of latches 47-49 to corresponding true inputs D of latches 57-59, respectively, and complementary outputs $\overline{Q}$ to corresponding complementary inputs $\overline{D}$ when the output of NOR gate 33 is a logic high. Transistors 50, 52, and 54 couple true outputs Q to true inputs D. Transistors 51, 53, and 55 couple complementary outputs $\overline{Q}$ to complementary inputs $\overline{D}$. Transistors 50 and 51 couple latch 47 to latch 57, transistors 52 and 53 couple latch 48 to latch 58, and transistors 54 and 55 couple latch 49 to latch 59. Latches 57-59 provide complementary pointer address signals $\overline{1P10}$-$\overline{1P12}$ on the $\overline{Q}$ outputs as the output of pointer 11. As part of the system circuit design it was desirable to use complementary signals instead of the true pointer address signals shown in FIG. 1. It is to be understood that true or complementary signals may be provided for system use.

Signal PPE is normally a logic high so that the output of NOR gate 30 is a logic low which causes inverter 31 to provide a logic high to NOR gate 33 and to delay circuit 32. Delay circuit 32 accordingly applies a logic high to NOR gate 33 and to transistors 40-45 which causes transistors 40-45 to be conductive. Both inputs to NOR gate 33 are a logic high so NOR gate 33 provides a logic low to transistors 50-55 keeping transistors 50-55 turned off. Of course either input of NOR gate 33 at a logic high causes NOR gate 33 to provide a logic low output. With transistors 40-45 turned on, latches 47-49 receive and latch every new logic state of signals $A_0$-$A_2$. With transistors 50-55 turned off, latches 57-59 are isolated from latches 47-49 and thereby unaffected by changes in signals $A_0$-$A_2$. Consequently, the logic state of signals 1P10-1P12 are also unaffected.

When signal PPE switches to a logic low, pointer 11 is then available to be selected for programming. For pointer 11 which receives true signals A3 and A4, pointer 11 is selected for programming when signals A3 and A4 are both a logic low. NOR gate 30 then provides a logic high to inverter 31 which in turn provides a logic low to delay circuit 32 and NOR gate 33. Delay circuit 32 is made by any conventional means to have a delay period which is appropriate for the particular system, for example, 50 nanoseconds. Upon receiving the logic low, delay circuit 32 will continue to provide a logic high to transistors 40-45 and to NOR gate 33 which thereby continues to provide a logic low to transistors 50-55. Consequently, during the delay period, transistors 40-45 will be turned on and transistors 50-55 will be turned off. This gives signals A0-A2 an opportunity to stabilize before latches 57-59 receive the new address signal. When the delay period has expired, delay circuit 32 provides a logic low to transistors 40-45 and to NOR gate 33 which in turn provides a logic high to transistors 50-55. Consequently, transistors 40-45 are turned off and transistors 50-55 are turned on. Latches 57-59 then receive and latch the logic state of corresponding latches 47-49. With transistors 40-45 turned off, any subsequent changes in address signals A0-A2 will not affect the programming of latches 57-59.

The output signal provided by inverter 31 must be a logic low for a sufficiently long time for both inputs to NOR gate 33 to be a logic low in order to change the program stored by pointer 11. The output signal of NOR gate 33 at a logic high is what actually achieves programming. The output signal of delay circuit 32 at a logic low prevents latches 47-49 from changing state during programming.

To come out of the programming cycle for pointer 11, one or more of signals A3, A4, and PPE switches to a logic high. NOR gate 30 switches to a logic low causing inverter 31 to provide a logic high to delay circuit 32 and NOR gate 33. NOR gate 33 responds by providing a logic low to transistors 50-55. Delay circuit 32, however, provides a delay period before switching from a logic low to a logic high. This provides a margin of safety to ensure that transistors 50-55 are all turned off before transistors 40-45 are turned on. This ensures that the intended logic states of latches 57-59 are not inadvertently altered coming out of the program cycle. Such protection is definitely necessary because address signals A0-A2 do not require nearly as much propagation delay before being received by transistors 40-45.

Pointers 12 and 13 are constructed the same as pointer 11 shown in FIG. 2 except that a unique combination of true and complementary signals A3 and A4 is received. The particular combination for each pointer is simply by designer choice. For example, pointer 12 could receive true signal A3 and the complement of signal A4, and pointer 13 could receive true signal A4 and the complement of signal A3. Of course, pointers 12 and 13 provide the complements of signals 2P10-2P12 and signals 3P10-3P12 as outputs.

Figure 3:
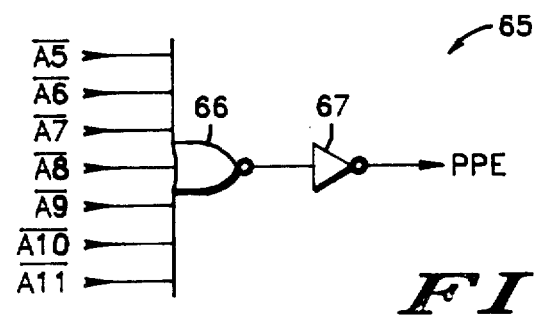
FIG. 3 is a schematic diagram of a circuit for generating signal useful in the pointer circuit of FIG. 2.

Shown in FIG. 3 is a circuit 65 for generating signal PPE comprised of a seven-input NOR gate 66 and an inverter 67. The seven inputs of NOR gate 66 are coupled, respectively, to the complements of address signals A5-A11. The output of NOR gate 66 is connected to the input of inverter 67. The output of inverter 67 provides signal PPE. Only when all of the inputs to NOR gate 66 are a logic low, will NOR gate 66 provide a logic high, causing signal PPE to be a logic low. Consequently signal PPE is at a logic high unless the complements of all signals A5-A11 are a logic low which, of course, implies that all signals A5-A11 are a logic high.

Figure 4:
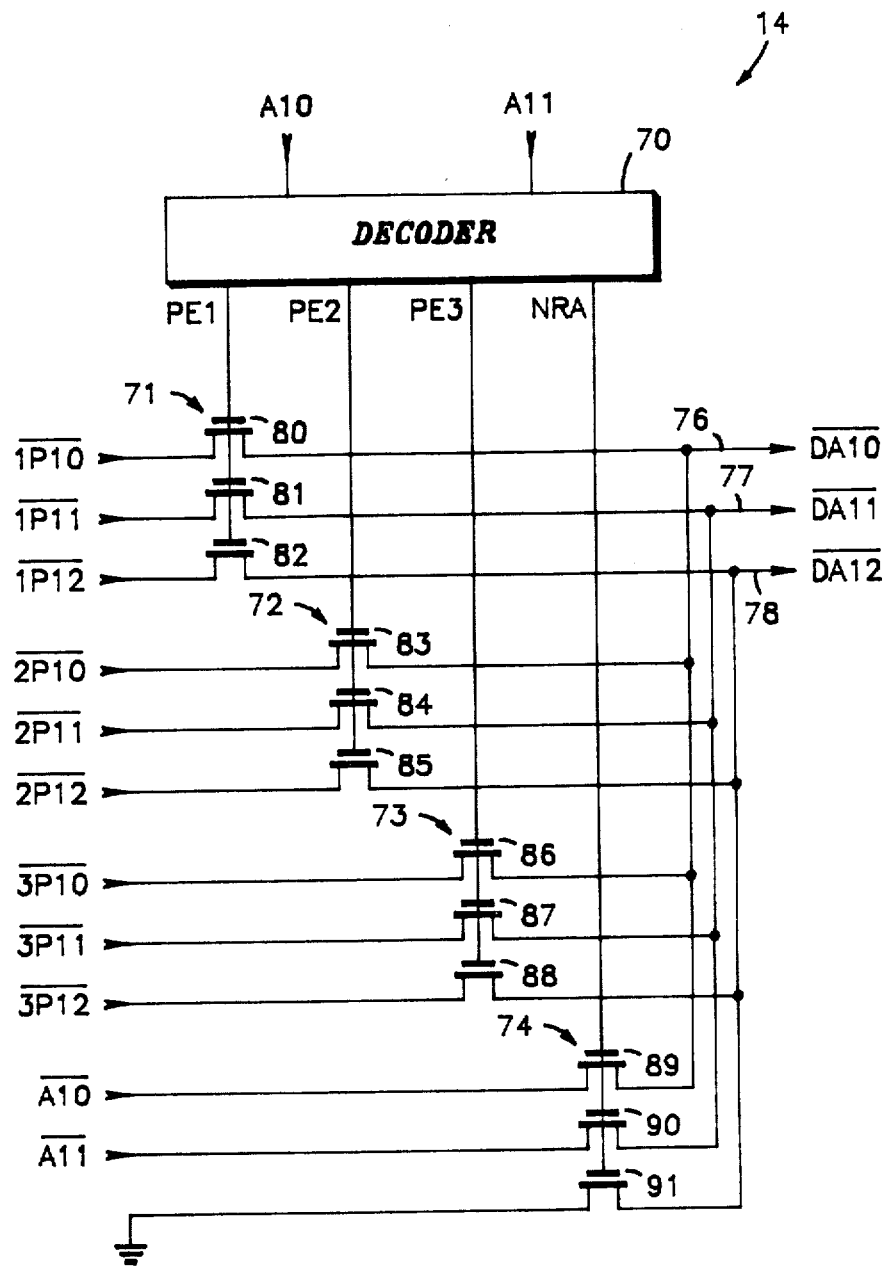
FIG. 4 is a schematic diagram of a pointer selector circuit used in the ROM of FIG. 1.

Shown in FIG. 4 is a schematic diagram of pointer selector 14 comprised generally of a decoder 70, a first set of coupling transistors 71, a second set of coupling transistors 72, a third set of coupling transistors 73, a fourth set of coupling transistors 74, a first common address line 76, a second common address line 77, and a third common address line 78. The first set of transistors comprises N channel transistors 80, 81, and 82. The second set of transistors comprises N channel transistors, 83, 84, and 85. The third set of transistors comprises N channel transistors 86, 87, and 88. The fourth set of transistors comprises N channel transistors 89, 90, and 91.

Decoder 70 is a one of four decoder constructed by any conventional means to provide one of four outputs at a logic high in response to address signals A10 and A11. The four outputs of decoder 70 are a pointer enable signal PE1, a pointer enable signal PE2, a pointer enable signal PE3, and a normal resident access signal NRA. When both signals A10 and A11 are a logic high, signal NRA is a logic high while signals PE1, PE2, and PE3 are a logic low. For other combinations of signals A10 and A11, another one of signals PE1, PE2, and PE3 will be a logic high while the remaining two and signal NRA will be a logic low. Which combinations of A10 and A11 that, determine which of signals PE1, PE2, PE3 and NRA become a logic high are chosen by conventional means for system use.

Transistors 80-82 have a control electrode for receiving signal PE1, a first current electrode for receiving the complement of a respective first pointer address signal 1P10-1P12, and a second current electrode coupled to a respective lines 76-78. Transistors 83-85 each have a control electrode for receiving signal PE2, a first current electrode for receiving the complement of a respective second pointer address signal 2P10-2P12, and a second current electrode coupled to a respective line 76-78. Transistors 86-88 each have a control electrode for receiving signal PE3, a first current electrode for receiving the complement of a respective third pointer address signal 3P10-3P12, and a second current electrode coupled to a respective line 76-78. Transistors 89-91 each have a control electrode for receiving signal NRA. Transistor 89 has a first current electrode for receiving the complement of signal A10, and a second current electrode coupled to line 76. Transistor 90 has a first current electrode for receiving the complement of signal A11, and a second current electrode coupled to line 77. Transistor 91 has a first current electrode coupled to ground, and a second current electrode coupled to line 78.

In response to any given combination of signals A10 and A11, one of signals PE1, PE2, PE3, and NRA will be at a logic high, turning on all of the transistors of the set of transistors, one of 71-74, which corresponds to the signal which is a logic high. For example, if signal PE2 is a logic high, then all of the transistors 83-85 of set of transistors 72 will be conducting. Accordingly, the complements of signals 2P10-2P12 will be coupled to lines 76-78. Lines 76-78 carrying the complements of decoder address signals DA10-DA12 to decoder 16 of FIG. 1. In this manner decoder 70 selects one of pointers 11-13 to provide the selection of one of pages 19-26. Page 26 can always be selected by causing signal NRA to be a logic high. This is done by both signals A10 and A11 being a logic high which implies that the complements will be a logic low. Consequently, when transistors 89-91 are turned on, all logic lows are coupled to lines 76-78. This will cause page 26 to be selected.

When decoder 70 provides signal PE1 at a logic high transistors 80-82 couple the address signals programmed into pointer 11 to lines 76-78. Because the signals on lines 76-78 determine which of pages 19-26 is selected, the programmed state of pointer 11 determines which of pages 19-26 is selected when signal PE1 is a logic high. Likewise when signal PE3 is a logic high transistors 86-88 couple the output of pointer 13 to lines 76-78. Consequently, when signal PE3 is a logic high, the programmed state of pointer 13 determines which of pages 19-26 is selected.

While the invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

I claim:

1. In a multi-page ROM having a plurality of pointers which are selectively programmable to provide page address signals which correspond to a chosen page of the ROM and which are programmed in response to a particular program address, the improvement comprising a pointer responsive to the occurence and removal of a first program address which comprises:

delay control means for providing a first signal a first predetermined delay period following the removal of the first program address, for providing a second signal and removing the first signal a second predetermined delay period following the occurrence of the first program address, and for removing the second signal in response to the removal of the first program address;

preliminary latch means for receiving and storing program address signals when the first signal is present;

output latch means for receiving and storing the program address signals stored in the preliminary latch means when the second signal is present and for providing said stored program address signals as the page address signals.

2. In the ROM of claim 1, wherein the delay means of the pointer comprises:

direction means for providing a pointer enable signal in response to the occurrence of the first program address;

a logic gate having a first input for receiving the pointer enabled signal, a second input for receiving the first signal, and an output for providing the second signal; and a delay circuit having an input for receiving the pointer enable signal and an output for providing the second signal in response to the pointer enable signal, wherein said response is delayed in time.

3. In the ROM of claim 2, wherein the logic gate of the delay means is a NOR gate.

4. In the ROM of claim 1, wherein the preliminary latch means of the pointer comprises:

a set of preliminary latches each having an input and an output, wherein data received on the input is latched and provided on the output; and a first plurality of transistors having control electrodes for receiving the first signal, and first and second current electrodes coupled to the inputs of the preliminary latches and the program address signals, respectively, for coupling the program address signals to the inputs of the preliminary latches when the first signal is present and for preventing the inputs of the preliminary latches from receiving the program address signals when the first signal is removed.

5. In the ROM of claim 4, wherein the output latch means of the pointer comprises:

a set of output latches each having an input and an output, wherein data received on the input is latched and provided on the output as the address which corresponds to a chosen page;

a second plurality of transistors having control electrodes for receiving the second signal, and first and second current electrodes coupled to the inputs of the output latches and the outputs of the preliminary latches, respectively, for coupling outputs of the preliminary latches to respective inputs of the output latches when the second signal is present and for preventing the inputs of the output latches from receiving the outputs of the preliminary latches when the second signal is removed.

6. In the ROM of claim 5, wherein the delay means of the pointer comprises:

detection means for providing a pointer enable signal in response to the occurrence of the first program address;

a logic gate having a first input for receiving the pointer enable signal, a second input for receiving the first signal, and an output for providing the second signal; and a delay circuit having an input for receiving the pointer enable signal and an output for providing the second signal in response to the pointer enable signal, wherein said response is delayed in time.

7. In the ROM of claim 6, wherein the logic gate of the delay means is a NOR gate.

8. In a multi-page ROM having a plurality of pointers which are selectively programmable to provide page address signals which correspond to a chosen page of the ROM and which are programmed in response to a particular program address, a method for programming a pointer in response to the occurrence and removal of a first program address comprising the steps of:

providing a first signal a first predetermined delay period following the removal of the first program address;

providing a second signal and removing the first signal a second predetermined delay period following the occurrence of the first program address;

removing the second signal in response to removing the first program address address;

receiving and storing program signals in a first latch when the first signal is present;

receiving and storing in a second latch the stored program address signals stored in the first latch when the second signal is present; and providing the program address signals stored in the second latch as page address signals.

* * * * *

UNITED STATES PATENT AND TRADEMARK OFFICE
CERTIFICATE OF CORRECTION

PATENT NO. : 4,500,961
DATED : February 19, 1985
INVENTOR(S) : Bruce E. Engles

It is certified that error appears in the above-identified patent and that said Letters Patent is hereby corrected as shown below:

In column 7, line 11, change "direction" to --detection--.

In column 8, line 38, change "address address" to --address--.

In column 8, line 39, insert --address-- after "program".

Signed and Sealed this

Twenty-fifth Day of June 1985

[SEAL]

Attest:

Attesting Officer

DONALD J. QUIGG

Acting Commissioner of Patents and Trademarks